United States Patent
Lock et al.

(10) Patent No.: US 8,819,391 B1
(45) Date of Patent: Aug. 26, 2014

(54) MEMORY CONTROLLER WITH ENHANCED BLOCK MANAGEMENT TECHNIQUES

(75) Inventors: Lai Khuan Lock, Georgetown (MY); Yin Chong Hew, Selama (MY)

(73) Assignee: Altera Corporation, San Jose, CA (US)

( * ) Notice: Subject to any disclaimer, the term of this patent is extended or adjusted under 35 U.S.C. 154(b) by 158 days.

(21) Appl. No.: 13/289,916

(22) Filed: Nov. 4, 2011

(51) Int. Cl.
*G06F 12/10* (2006.01)
*G11C 29/18* (2006.01)

(52) U.S. Cl.
CPC .... *G06F 12/1027* (2013.01); *G11C 2029/1806* (2013.01)
USPC ......................................................... 711/206

(58) Field of Classification Search
None
See application file for complete search history.

(56) References Cited

U.S. PATENT DOCUMENTS

| | | | | |
|---|---|---|---|---|
| 5,684,962 A | * | 11/1997 | Black et al. | 709/238 |
| 5,933,852 A | * | 8/1999 | Jeddeloh | 711/153 |
| 7,619,438 B1 | * | 11/2009 | Trimberger | 326/10 |
| 2002/0108072 A1 | * | 8/2002 | Beng Sim et al. | 714/5 |
| 2004/0004917 A1 | * | 1/2004 | Lee | 369/47.14 |
| 2007/0291552 A1 | * | 12/2007 | Khatami et al. | 365/185.33 |

* cited by examiner

*Primary Examiner* — Duc Doan
(74) *Attorney, Agent, or Firm* — Womble, Carlyle, Sandridge & Rice (57) ABSTRACT

Methods and apparatuses for managing unusable blocks in a memory module are provided. The memory table may include a plurality of unusable block addresses in the memory module where the plurality of unusable block addresses is arranged in a sequential order in the memory table. A number of unusable blocks in the memory module is identified by reading a word that represents the number of unusable blocks from the memory table. A first pair of addresses comprises a first unusable block address and a first corresponding mapped memory address. The pair of addresses are read from the memory table and stored in a storage element of a controller. Only a single pair of addresses is stored in the storage element of the controller at any one time according to one embodiment.

20 Claims, 7 Drawing Sheets

MEMORY CONTROLLER WITH ENHANCED BLOCK MANAGEMENT TECHNIQUES

BACKGROUND

Integrated circuits (ICs) are used in various applications and devices. ICs may include memory modules such as an embedded non-volatile memory (NVM) module that has the capability to retain the stored data even when the device is not powered.

NVM module may have many applications. For example, an external NVM module, e.g., a flash memory module, may be used to configure an IC device. Configuration data stored in the NVM module is assessed by a memory controller. The memory controller may be included in the IC device itself or may be placed on a separate device that is used to configure the IC device. The memory controller manages the data stored in the NVM and communicates with the device that is being configured.

Generally speaking, an NVM module may have multiple unusable blocks, i.e., blocks or cells in the module that have worn out and cannot be written to or read from, that need to be remapped. A table, commonly referred to as a bad block table, that includes all the unusable block addresses is usually kept in the NVM module and a memory controller needs to be able to read and access the table in order to properly map every unusable block address to a corresponding spare block in the NVM module.

Typically, the memory controller needs to have enough storage capacity to store all the unusable block information from the unusable block table. This may be inefficient because the number of unusable blocks varies across different memory modules. For instance, a 512 MB NVM module with a total of 4096 blocks will have a maximum of 80 unusable blocks, assuming the maximum number of unusable blocks to be approximately 2% of the total number of blocks. An NVM module with a greater storage capacity and a higher number of memory blocks has a greater number of unusable blocks.

Therefore, the memory controller will need to have enough storage capacity in order to store the maximum number of possible unusable block addresses. As a result, the memory controller may need a higher than required storage capacity in order to accommodate different types of NVM modules with different storage capacities.

SUMMARY

Embodiments of the present invention include techniques for managing unusable blocks in a memory module.

It is appreciated that the present invention can be implemented in numerous ways, such as a process an apparatus, a system, a device or a method on a computer readable medium. Several inventive embodiments of the present invention are described below.

In one embodiment, a method for managing unusable blocks in a memory module is provided. The method includes determining the type of memory table used from a value stored in the memory table. The memory table includes a plurality of unusable block addresses in the memory module. The plurality of unusable block addresses is arranged in a sequential order in the memory table. A number of unusable blocks in the memory module is identified by reading a word, from the memory table, that represents the number of unusable blocks. A first pair of addresses composed of a first unusable block address and a first corresponding mapped memory address are read from the memory table and the first pair of addresses are stored in a memory controller. The first corresponding mapped memory address is a usable address to replace the unusable block address. Only a single pair of addresses is stored in the storage element of the controller at any one time in one embodiment.

In another embodiment, a method for creating a table for a memory module is provided. The method includes generating an identification value for the table where the identification value represents an order of the table. A total number of unusable blocks in the memory module is determined and a plurality of unusable block addresses in the memory module is determined. The plurality of unusable block addresses is arranged in a sequential order in the memory table. In one embodiment, contents in the table may be arranged in ascending order.

In another embodiment, a system is disclosed. The system includes a control block and a memory management block coupled to the control block. The control block is operable to retrieve and store a current unusable block address that is an address for a memory hit pointing to an unusable block address. A memory module with a plurality of unusable block addresses stored in a particular order, such as an ascending order or descending order of each address, is coupled to the memory management block. The memory management block is operable to retrieve one unusable block address from the plurality of unusable block addresses from the memory module. The retrieved unusable block address is stored as the current read unusable block address in a storage element of the memory management block.

Other aspects of the exemplary embodiments will become apparent from the following detailed description, taken in conjunction with the accompanying drawings, illustrating by way of example the principles of the embodiments.

BRIEF DESCRIPTION OF THE DRAWINGS

The exemplary embodiments may best be understood by reference to the following description taken in conjunction with the accompanying drawings.

DETAILED DESCRIPTION

The following embodiments describe techniques for managing unusable blocks in a memory module.

It will be obvious, however, to one skilled in the art, that the present exemplary embodiments may be practiced without some or all of these specific details. In other instances, wellknown operations have not been described in detail in order not to unnecessarily obscure the present embodiments.

The embodiments described herein provide techniques to manage unusable blocks in a memory module. According to one embodiment of the present invention, unusable blocks in the memory module are identified in order to remap memory accesses from the unusable blocks to usable blocks. Typically, there are a few unusable blocks in a memory module, e.g., a non-volatile memory module. Some of these blocks become unusable because of manufacturing defects while others deteriorate after multiple read and write cycles. An "unusable block table" is used to record unusable blocks in a particular memory module. Unusable block addresses are written to the unusable block table and stored in a reserved area of the memory module. Additional unusable blocks that form during operation of the device are detected and written to the unusable block table.

Figure 1A:
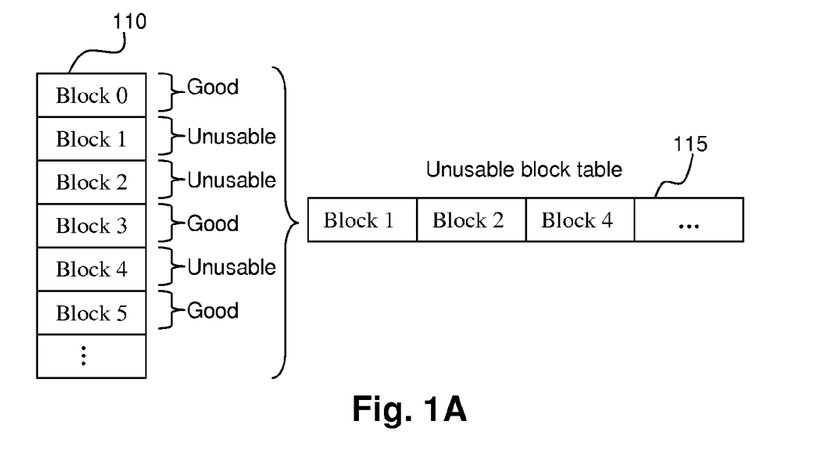
FIG. 1A, meant to be illustrative and not limiting, shows an exemplary unusable block table for an associated memory module.

FIG. 1A, meant to be illustrative and not limiting, shows an exemplary unusable block table 115 for memory module 110. Several memory blocks are shown in memory module 110 of FIG. 1A. In one embodiment, unusable block table 115 represents a table associated with the "skip block" technique. In the "skip block" technique, when the memory access corresponds to an unusable block address, the data is stored at or read from the next usable block. In other words, the unusable or "bad" block is skipped and the unusable block table is updated with the unusable block address. In the example of FIG. 1A, blocks 1, 2 and 4 of memory module 110 are unusable and their respective block addresses are stored in unusable block table 115. The addresses are stored in no particular order and additional blocks that become unusable are recorded at the end of unusable block table 115. As such, the whole unusable block table 115 needs to be stored in a memory controller when the memory module is used.

Figure 1B:
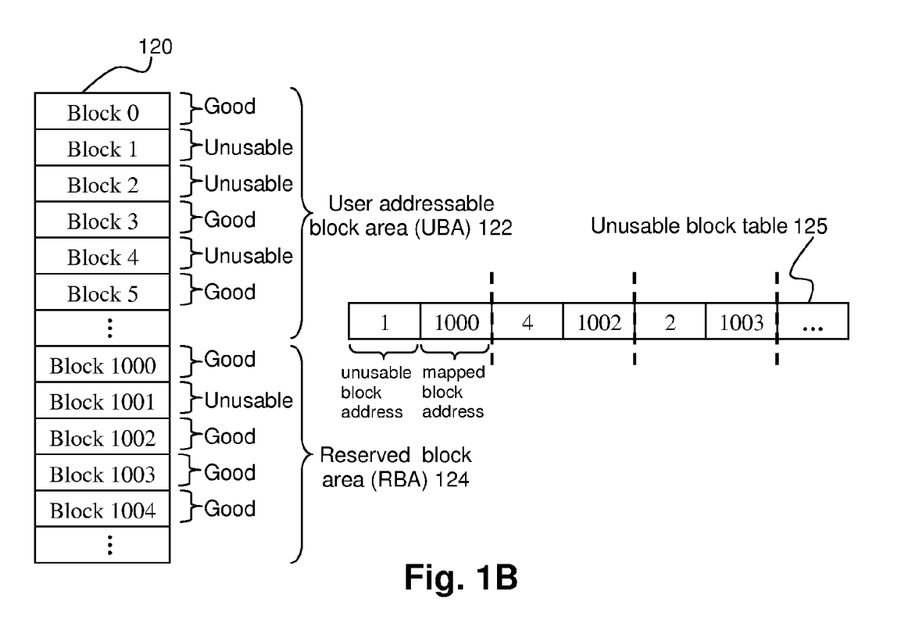
FIG. 1B, meant to be illustrative and not limiting, shows a memory module with a corresponding unusable block table.

FIG. 1B, meant to be illustrative and not limiting, shows memory module 120 with corresponding unusable block table 125. Memory module 120 is divided into two different areas, i.e., a user addressable block area (UBA) 122 and a reserved block area (RBA) 124. The UBA 122 is used to store user data, e.g., configuration data, while the RBA 124 is used as spare memory blocks. In the embodiment of FIG. 1B, unusable blocks in memory module 120 are not skipped but replaced by usable ones from RBA 124. Typically, the reserved area, i.e., RBA 124, is approximately 2% of the total number of blocks in memory module 120. In the embodiment of FIG. 1B, blocks 1, 2, 4 and 1001 of memory module 120 are unusable. The unusable blocks 1, 2, 4, and 1001 may be replaced with good blocks. For example, unusable block 1 may be replaced with block 1000 in RBA 124. The unusable block 1 and block 1000 replacing the unusable block 1 may be stored in table 125 as a pair of addresses. As such, each of the unusable blocks from UBA 122 may be paired up with a working block from RBA 124 and stored in table 125.

Referring still to FIG. 1B, each unusable block is mapped to a good memory block, where the good memory block replaces the unusable block, and where the pair of memory addresses is stored in unusable block table 125. For instance, block 1 is mapped to block 1000, block 4 is mapped to block 1002, and block 2 is mapped to block 1003. Block 1001 from the reserved area 124 is not used or mapped with anything because block 1001 is an unusable block from RBA 124. Other blocks in UBA 122 that become unusable are mapped to corresponding blocks in reserved area 124 and the block addresses are appended to unusable block table 125. Block addresses in unusable block table 125 are stored in no particular order. In the embodiment of FIG. 1B, block 2 is identified as being unusable after block 4 became unusable. Therefore, block 2 is recorded after block 4 in unusable block table 125. For instance if block 3 becomes unusable, block 3 may be mapped to block 1004 and further appended at the end of unusable block table 125. Therefore, unusable block table 125 needs to be constantly updated and the full table needs to be stored in the controller module that is connected to memory module 120. As such, the controller module may be sufficiently large to store the whole list of unusable block addresses and their corresponding mapped addresses.

Figure 2:
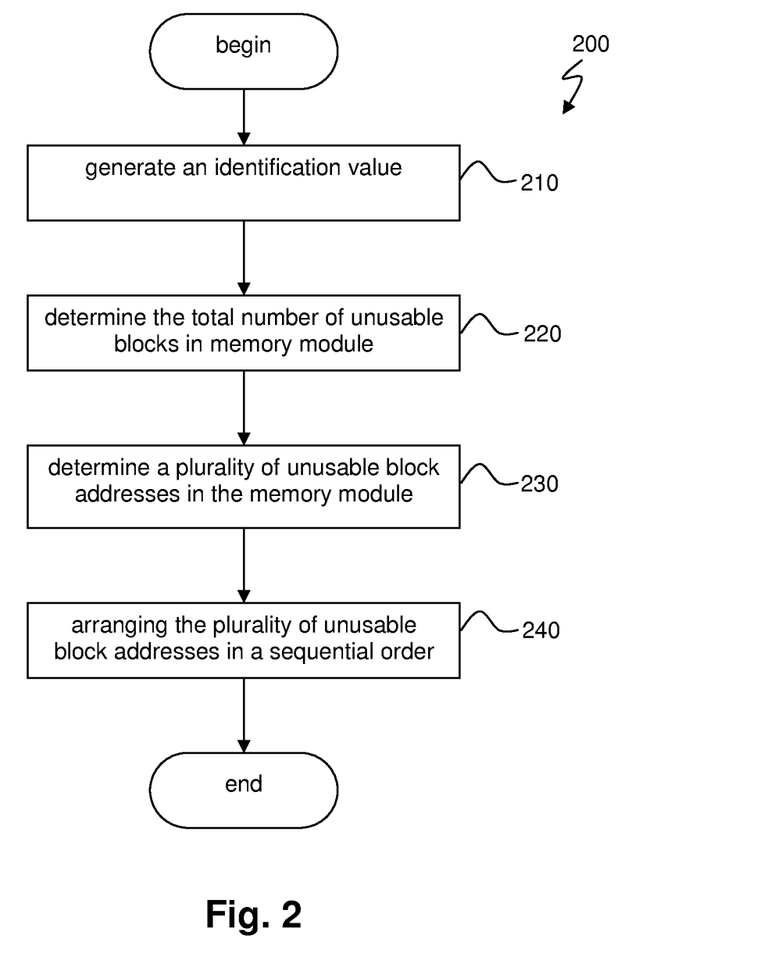
FIG. 2, meant to be illustrative and not limiting, shows a method flow for creating a memory table for a memory module as one embodiment.

FIG. 2, meant to be illustrative and not limiting, shows method flow 200 for creating a memory table for a memory module as one embodiment. Flow 200 begins by generating an identification value in operation 210. The identification value can be used to identify the type of table being generated or the order of the memory addresses stored in the table. Thus, the identification value indicates the memory addresses identified as replacements for the unusable block addresses are arranged in an ascending or descending order in one embodiment. A total number of unusable memory blocks is determined in operation 220. Addresses of the unusable blocks in the memory module are determined in operation 230 and the addresses are arranged in a sequential order in operation 240. In one embodiment, the addresses are arranged in ascending order and stored in a reserved portion of the memory module. In the exemplary embodiment of FIG. 1B as explained above, as more unusable blocks form in the memory module, the unusable block addresses are appended to the end of memory table 125. However, the block addresses identified to replace or substitute for the unusable block addresses generated through method flow 200 are arranged in a sequential order, i.e., either in an ascending or a descending order.

Figure 3A:
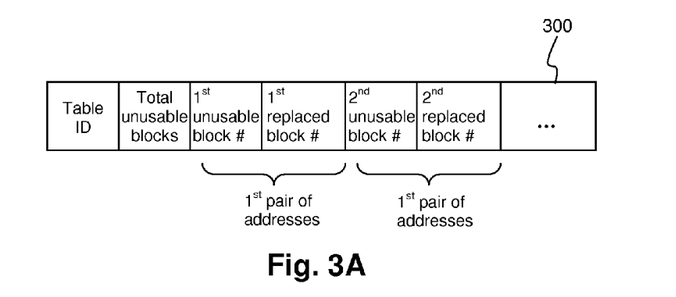
FIG. 3A, meant to be illustrative and not limiting, shows an exemplary memory table as one embodiment.

FIG. 3A, meant to be illustrative and not limiting, shows an exemplary memory table 300 as one embodiment. Memory table 300 is arranged in a sequential order. The identification that identifies the structure of memory table 300 is stored as a first word of memory table 300. In one embodiment, the identification is used to represent the order of the memory addresses stored in memory table 300. For instance, when the memory addresses are arranged in an ascending order, i.e., from low addresses to high addresses, one identification value is used. When the memory addresses are arranged in a descending order, i.e., from high addresses to low addresses, another identification value is used. The second word of memory table 300 stores the total number of unusable memory blocks in the memory that is associated with memory table 300. In one embodiment, the total number of unusable blocks is used to determine the last pair stored in memory table 300. Subsequent words in memory table 300 include unusable block addresses in the associated memory module. In one embodiment, each unusable block address is mapped with a corresponding reserved block address for replacing the corresponding unusable block address. Every pair, which is composed of the unusable block address and a corresponding reserved block address, is stored as two words in memory table 300. In an exemplary embodiment, the unusable block addresses in memory table 300 are arranged in ascending order.

Figure 3B:
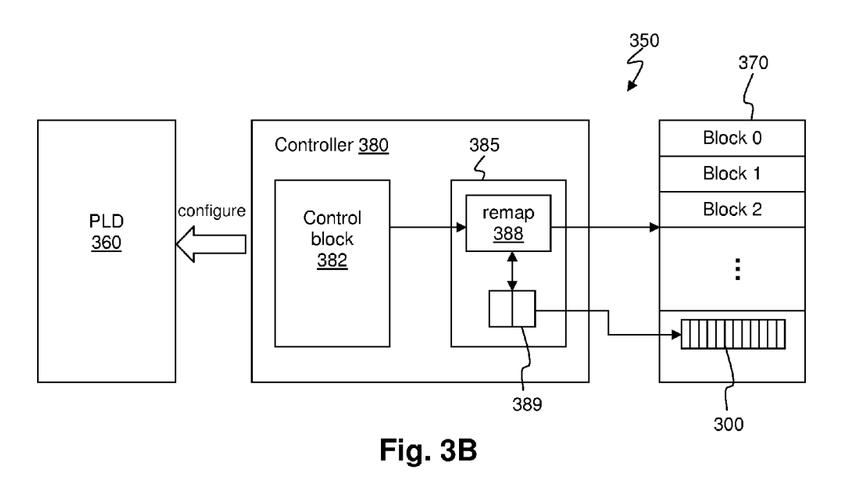
FIG. 3B, meant to be illustrative and not limiting, shows a system for configuring a programmable logic device (PLD) to map memory addresses to adjust for unusable block addresses as one embodiment.

FIG. 3B, meant to be illustrative and not limiting, shows system 350 for configuring a programmable logic device (PLD) 360 as one embodiment. System 350 includes PLD 360 that is configured with data stored in memory module 370 through controller module 380. Controller module 380 is coupled to memory module 370 and acts as an interface between PLD 360 and memory module 370. Controller module 380 includes control block 382 and a memory management block 385. In the exemplary embodiment of FIG. 3B, memory management block 385 includes remapping block 388 and storage block 389. Remapping block 388 and storage block 389 of memory management block 385 are coupled to memory module 370.

In the exemplary embodiment of FIG. 3B, memory module 370 is a non-volatile memory, e.g., a flash memory module, with multiple memory blocks. A memory table, e.g., memory table 300 of FIG. 3A, is stored in memory module 370. In one embodiment, memory table 300 that is stored in memory module 370 contains a plurality of unusable block addresses in memory module 370 arranged in ascending order. In another embodiment, memory module 370 is similar to memory module 120 of FIG. 1B and is divided into a user portion that contains configuration data for PLD 360 and a reserved portion that includes a plurality of reserved memory addresses. Unusable blocks in the user portion of memory module 370 are mapped to memory blocks in the reserved portion.

Referring still to FIG. 3B, controller module 380 retrieves a pair of addresses, i.e., the unusable block and its corresponding mapped address, incrementally from memory table 300 in memory module 370 prior to retrieving configuration data from memory module 370, e.g., blocks 0, 1, 2, etc. In an exemplary embodiment, instead of storing the whole memory table 300, storage block 389 of memory management block 385 stores only a pair of memory addresses at any one time. For every memory access to memory module 370, memory management block 385 checks the current read unusable memory address in storage block 389. If the current memory access matches the unusable block address stored in storage block 389, then the current memory access is diverted to the corresponding mapped address stored in storage block 389.

Remapping block 388 remaps the current memory address to the corresponding mapped memory address and configuration data is read from the mapped address block instead. In one embodiment, controller module 380 is an IC device that is configured to act as an interface between memory module 370 and PLD 360 and control block 382 is logic arranged based on configuration data to perform some task that resides in controller module 380 to control the configuration of PLD 360. It should be appreciated that controller module 380 may be integrated into PLD 360. For instance, PLD 360 may include an IP block that operates as a controller module similar to controller module 380. It should be appreciated that if there is a mismatch between the memory access and the unusable block address then the configuration data is read from memory 370.

Figure 4A:
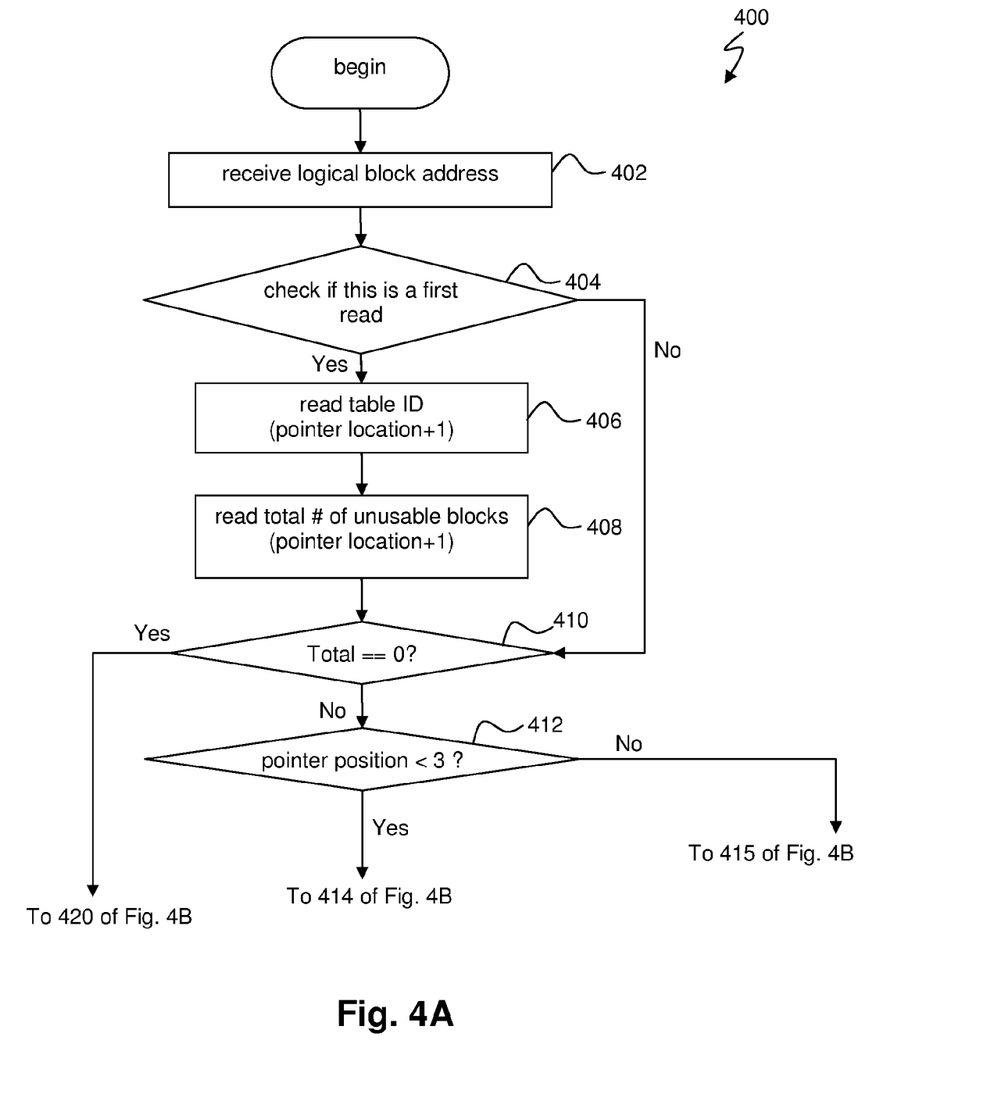
FIGS. 4A and 4B, meant to be illustrative and not limiting, show a method flow as another embodiment.
Figure 4B:
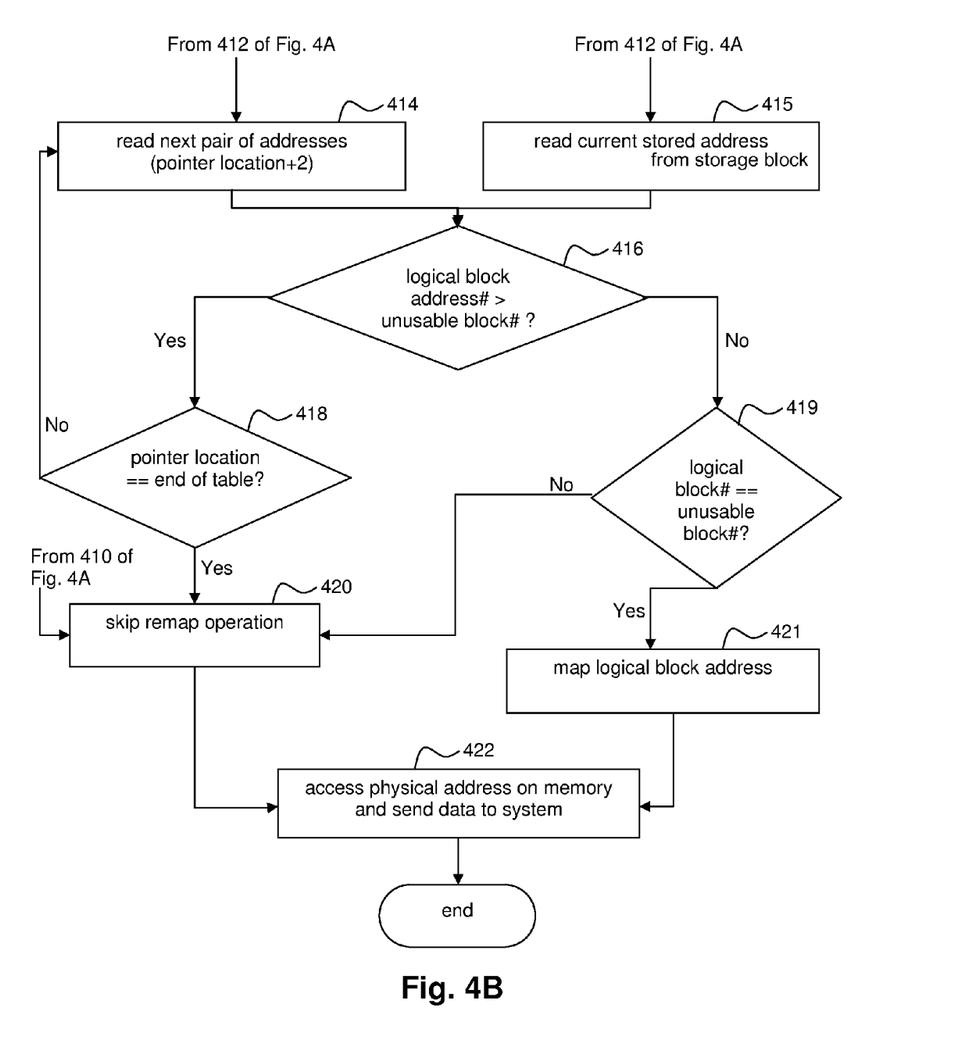

FIGS. 4A and 4B, meant to be illustrative and not limiting, show method flow 400 as another embodiment. In an exemplary embodiment, flow 400 represents the operations performed by a PLD configuration system similar to system 350 of FIG. 3B. Flow 400 begins by receiving a logical block address at a controller module in operation 402. In one embodiment, the controller block, e.g., controller block 382 of FIG. 3B, sends the logical block address to a memory management block, e.g., memory management block 385 of FIG. 3B, and the memory management block reads from the memory table. In operation 404, the memory table associated with the system is checked to determine if this is a first memory read. In one embodiment, a counter setting can indicate if this is a first memory read. If it is not a first memory read, the method flow skips the next two operations 406 and 408 and checks if the total number of unusable blocks is equal to 0 in operation 410.

Continuing from FIG. 4A, if it is a first memory access, an identification value is read from the memory table in operation 406. In an exemplary embodiment, the identification value identifies the order of memory addresses stored in the memory table. In one embodiment, the position of the pointer is increased in operation 406 after the identification value is read to move the pointer to the next word in the memory table. However, it is appreciated that other methods may be employed to read the next word in the memory table. A total number of unusable blocks is read from the memory table in operation 408. The total number of unusable blocks is used to determine the total number of unusable block addresses stored in the particular memory table so that the total number of possible positions of the pointer (which matches the total number of unusable block addresses) can be identified. The position of the pointer is incremented after the total number of unusable block addresses is read in operation 408. At step 410, it is determined whether the number of unusable blocks is more than zero. If the total number of unusable blocks is equal to 0, then the remap operation skips to operation 420 of FIG. 4B and data is read from the memory module, e.g., memory module 370 of FIG. 3B, and sent back to the system in operation 422 of FIG. 4B. Otherwise, the pointer position is checked in operation 412 to determine if the first unusable block address in the memory table has been read before, e.g., through a counter setting or other suitable means. It should be appreciated that other suitable means may be utilized in place of a counter.

Referring to FIG. 4B, if the memory table has not been read before, in operation 414 of FIG. 4B, a first unusable block address is read from the memory table and stored in a storage block in the controller. In one embodiment, the memory table is similar to memory table 300 of FIG. 3A and every unusable block address is mapped to a corresponding address in a reserved area in the memory module. In another embodiment, the memory table stores only a list of unusable block addresses and the unusable blocks are not mapped to any reserved addresses. In this case, the unusable block is skipped and not mapped to a corresponding address.

Referring still to FIG. 4B, if the pointer position is less than three, e.g., through a counter indicating the pointer position in one embodiment, in operation 412 of FIG. 4A then the memory table has not been read before and the current read operation is a first read of a first pair of memory addresses from the memory table. If the pointer position determined in operation 412 of FIG. 4A indicates that the memory table has been read before, i.e., the pointer position identified through a counter setting is greater than 3 in one embodiment, then the method has cycled through the process identified by FIGS. 4A and 4B previously. The unusable block address stored in the storage block of the controller module is read from the storage block in operation 415. In the exemplary embodiment of FIG. 3B, storage block 389 in controller module 380 stores the last read unusable block address. The logical block address is checked in operation 416. If the logical block address is greater than the current stored unusable block address, the position of the pointer, through the counter value in one embodiment, is checked in operation 418. If the pointer does not point to the end of the memory table, then the next pair of addresses, i.e., the next unusable block address and its corresponding mapped address, are retrieved from the memory table in operation 414. If the logical block address is smaller than the unusable block address that is obtained from either operation 414 or operation 415, then the logical block address is compared with the current stored unusable block address in operation 419. If the logical block address matches the current stored unusable block address, the logical block address is mapped to the corresponding block address in operation 421. Otherwise, the remapping operation is skipped in operation 420. The physical address obtained is sent to the memory module in the system and data is read from the physical address in operation 422. It should be appreciated that the embodiments provide for the orderly reading and remapping of the memory addresses to accommodate unusable memory addresses. By utilizing a counter to track a pointer position as illustrated in FIGS. 4A and 4B, when the memory addresses mapped are ordered in one of a descending or ascending order. While FIGS. 4A and 4B illustrate a method of tracking the pointer location through a counter setting, other suitable techniques may be utilized in place of the counter. In one embodiment, the memory module is a non-power dependant memory module and configuration data is read sequentially from the memory module.

Figure 5:
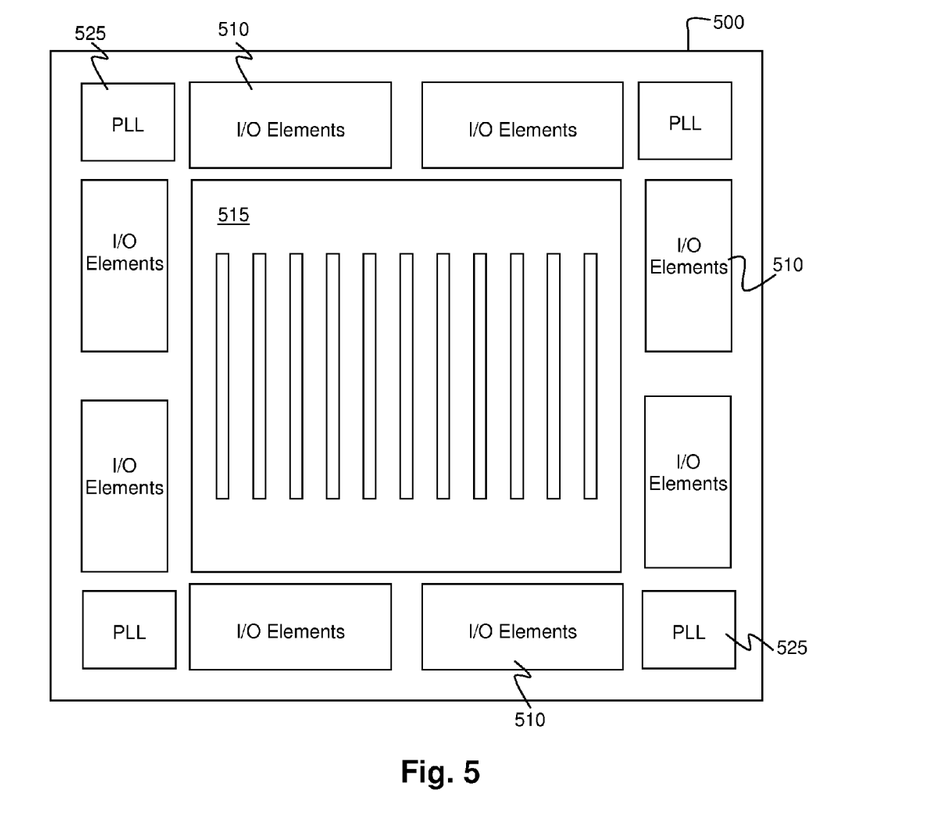
FIG. 5, meant to be illustrative and not limiting, shows a simplified block diagram of a programmable logic device (PLD) that can include aspects of the present embodiments.

FIG. 5, meant to be illustrative and not limiting, shows a simplified block diagram of PLD 500 that can include aspects of the present invention. Programmable device 500 includes logic region 515 and I/O elements 510. I/O elements 510 may support a variety of memory interfaces. Other auxiliary circuits such as phase-locked loops (PLLs) 525 for clock generation and timing, can be located outside the core logic region 515, e.g., at corners of programmable device 500 and adjacent to I/O elements 510.

Referring still to FIG. 5, logic region 515 may be populated with logic cells which include, among other things, "logic elements" (LEs). LEs may include look-up table-based logic regions and these logic elements may be grouped into "Logic Array Blocks" (LABs). The logic elements and groups of logic elements or LABs can be configured to perform logical functions desired by the user. Logic region 515 may also include a plurality of embedded memory blocks and logic blocks that are configured as an IP core. It is appreciated that IP blocks, frequently referred to as IP cores, are logic blocks that include proprietary configuration data for various commonly-used functions, e.g., digital signal processors, NAND flash memory controllers, etc. For instance, logic region 515 may include an IP block for a memory controller similar to controller 380 in the embodiment of FIG. 3B. A CPU external to PLD 500 can also be communicating with the memory controller in PLD 500.

Figure 6:
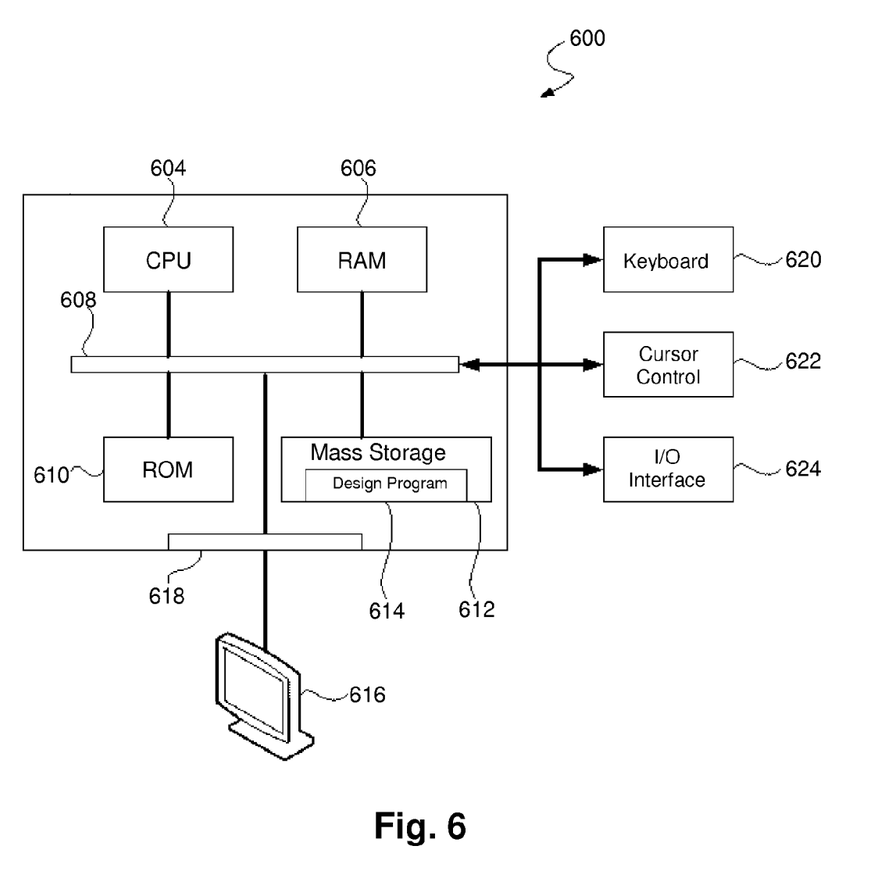
FIG. 6 is a simplified schematic diagram of a computer system for implementing aspects of the embodiments.

FIG. 6 is a simplified schematic diagram of a computer system 600 for implementing embodiments of the present invention. It should be appreciated that the methods described herein may be performed with a digital processing system, such as a conventional, general-purpose computer system. Special-purpose computers, which are designed or programmed to perform one function may be used in the alternative. In addition, the computer system of FIG. 6 may be used for configuring a PLD, e.g., PLD 500 of FIG. 5. The computer system includes a central processing unit (CPU) 604, which is coupled through bus 608 to random access memory (RAM) 606, read-only memory (ROM) 610, and mass storage 612. Mass storage device 612 represents a persistent data storage device such as a floppy disc drive or a fixed disc drive, which may be local or remote. Design program 614, e.g., an EDA tool that can perform any or all of the operations illustrated in FIG. 2, or an EDA tool that can configure a memory controller to perform any or all of the operations illustrated in FIG. 4, resides in mass storage 612, but can also reside in RAM 606 during processing. It should be appreciated that CPU 604 may be embodied in a general-purpose processor, a special-purpose processor, or a specially programmed logic device.

Referring still to FIG. 6, display 616 is in communication with CPU 604, RAM 606, ROM 610, and mass storage device 612, through bus 608 and display interface 618. Display 616 is configured to display the user interface and visual indicators or graphical representations described herein. Keyboard 620, cursor control 622, and interface 624 are coupled to bus 608 to communicate information in command selections to CPU 604. This user input is then communicated to CPU 604. It should be appreciated that data to and from external devices may be communicated through interface 624.

The embodiments, thus far, were described with respect to integrated circuits. The method and apparatus described herein may be incorporated into any suitable circuit. For example, the method and apparatus may be incorporated into numerous types of devices such as microprocessors or programmable logic devices. Exemplary programmable logic devices include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method comprising:
retrieving a value of a total number of unusable blocks in a memory module, wherein the memory module stores a memory table that includes a plurality of unusable block addresses within the memory module, and wherein the memory table stores the value of the total number of unusable blocks;
reading a first pair of addresses comprising a first unusable block address and a first mapped memory address associated with the first unusable block address; and storing the first pair of addresses in a storage element of a memory management block.

2. The method of claim 1 further comprising:
reading a second pair of addresses comprising a second unusable block address and a second mapped memory address associated with the second unusable block address, wherein the second unusable block address is a successive unusable block address to the first unusable block address in said memory table; and
storing the second pair of addresses in the storage element, wherein the second pair of addresses replaces the first pair of addresses in the storage element.

3. The method of claim 1, wherein unusable block addresses of the plurality of unusable block addresses are ordered in ascending order, and wherein the memory table includes an identifier that indicates the ascending order.

4. The method of claim 1, wherein the memory module includes configuration data used to configure a programmable logic device, and wherein the method comprises:
determining a type of memory table from a value of an identifier stored in the memory table, wherein the memory table includes a plurality of unusable block addresses of a memory module associated with the memory table, wherein the plurality of unusable block addresses is arranged in a sequential order in the memory table, wherein the sequential order is one of ascending or descending according to the type of the memory table, and wherein a single pair, and only a single pair, of addresses is stored in the storage element at any one time.

5. The method of claim 1 further comprising:
reading the first pair of addresses stored from the storage element;
determining whether the first unusable block address matches a current memory access;
reading from the first mapped memory address of the memory module in response to a match between the current memory access and the first unusable block address;
reading from the current memory access of the memory module in response to a mismatch between the current memory access and the first unusable block address; and
reading a subsequent pair of addresses composed of a subsequent unusable block address and a subsequent corresponding mapped memory address from the memory table when the current memory access does not match the unusable block address.

6. The method of claim 4 further comprising:
reading the single pair of addresses stored in the storage element;
determining whether an unusable block address from the single pair of addresses matches a current memory access;
reading from a mapped memory address from the single pair of addresses when the current memory access matches the unusable block address; and
reading a subsequent pair of addresses comprising a subsequent unusable block address and a subsequent mapped memory address from the memory table when the current memory access does not match the unusable block address.

7. The method of claim 1 further comprising:
storing the value of the total number of unusable blocks in a controller;
determining a position of a pointer of the memory table; and
comparing the position of the pointer with the value of the total number of unusable blocks in the memory module to determine whether the pointer points to an end of the memory table, wherein the determining and the comparing is achieved through a counter value tracking the position of the pointer.

8. The method of claim 1 further comprising:
incrementing a position of a pointer to a next word of the memory table after each of the identifying and the reading.

9. A method of creating a table for a memory module, said method comprising:
determining a value of a total number of unusable blocks in the memory module;
storing the value of the total number of unusable blocks as an explicit number in the memory module,
determining addresses associated with said unusable blocks to form a plurality of unusable block addresses; and
arranging the plurality of unusable block addresses in a sequential order, wherein at least one method operation is executed through a processor.

10. The method of claim 9, wherein the plurality of unusable block addresses is arranged in an ascending order, as indicated by a value of an identifier, the identifier stored in the memory module.

11. The method of claim 9 further comprising:
reading a first pair of addresses comprising a first unusable block address and a first mapped memory address from the memory table.

12. The method of claim 9, wherein the memory module is divided into a user portion for a programmable logic device and a reserved portion, wherein the reserved portion includes a plurality of reserved memory addresses, and wherein the table is stored in the reserved portion.

13. The method of claim 12 further comprising:
mapping each address associated with the unusable blocks of the plurality of unusable block addresses to a reserved memory address of the plurality of reserved memory addresses; and
pairing each address associated with the unusable blocks of the plurality of unusable block addresses with the reserved memory address in an ascending order of the plurality of unusable block addresses.

14. A system, comprising:
a control block;
a memory management block coupled to the control block, wherein the control block is operable to retrieve and store a current read unusable block address; and
a memory module having a plurality of unusable block addresses, the memory module further having a portion that stores an explicit value of a total number of unusable memory blocks of the memory module, the memory module coupled to the memory management block, wherein the memory management block is operable to retrieve an unusable block address from the plurality of unusable block addresses from the memory module, wherein the unusable block address is stored as the current read unusable block address in a storage element of the memory management block.

15. The system of claim 14, further comprising:
a programmable logic device (PLD) coupled to the control block, wherein the control block is operable to configure the PLD and wherein the plurality of unusable block addresses are stored in a predetermined order and wherein a single, and only a single, current read unusable block address is stored in the storage element at any one time.

16. The system of claim 14, wherein the memory management block stores the unusable block address with a corresponding mapped memory address, wherein the memory management block is operable to retrieve the unusable block address and the corresponding mapped memory address from a memory table, wherein the unusable block address is paired with the corresponding mapped memory address as a pair, and wherein a single, and only a single, such pair is stored in the memory management block at any one time.

17. The system of claim 14, wherein the plurality of unusable block addresses is stored in a table in the memory module, and wherein the plurality of unusable block addresses is arranged in an ascending order indicated by a value of an identifier stored in the memory module.

18. The system of claim 14, wherein the memory management block further comprises:
an address mapping block coupled to the storage element of the memory management block and the memory module, wherein the address mapping block is operable to remap the current read unusable block address to a corresponding mapped memory address from the memory module.

19. The system of claim 18, wherein the memory module is divided into a user portion for a programmable logic device and a reserved portion, wherein the reserved portion includes a plurality of reserved memory addresses, and wherein the corresponding mapped memory address is a reserved memory address from the plurality of reserved memory addresses.

20. The system of claim 14, wherein the memory module is a non-power dependent memory module.

* * * * *